(12) United States Patent
Stavrou et al.

(10) Patent No.: US 7,263,633 B2
(45) Date of Patent: Aug. 28, 2007

(54) INTEGRATED CIRCUIT, IN PARTICULAR INTEGRATED MEMORY, AND METHODS FOR OPERATING AN INTEGRATED CIRCUIT

(75) Inventors: Evangelos Stavrou, München (DE); Stephan Schröder, München (DE); Manfred Pröll, Dorfen (DE); Koen Van der Zanden, Heverlee (BE)

(73) Assignee: Infineon Technologies AG, Neubiberg (DE)

( * ) Notice: Subject to any disclaimer, the term of this patent is extended or adjusted under 35 U.S.C. 154(b) by 476 days.

(21) Appl. No.: 10/852,116

(22) Filed: May 25, 2004

(65) Prior Publication Data

US 2004/0240262 A1 Dec. 2, 2004

(30) Foreign Application Priority Data

May 26, 2003 (DE) .................................. 103 23 865

(51) Int. Cl.
*G06F 11/00* (2006.01)
(52) U.S. Cl. .................................. 714/30; 714/5; 714/42
(58) Field of Classification Search .................... 714/5, 714/8, 30, 37, 42
See application file for complete search history.

(56) References Cited

U.S. PATENT DOCUMENTS

| 5,956,350 | A | | 9/1999 | Irrinki et al. | |
|---|---|---|---|---|---|
| 6,085,334 | A | * | 7/2000 | Giles et al. | 714/30 |
| 6,397,349 | B2 | * | 5/2002 | Higgins et al. | 714/42 |
| 6,408,401 | B1 | * | 6/2002 | Bhavsar et al. | 714/8 |
| 6,496,947 | B1 | * | 12/2002 | Schwarz | 714/30 |
| 6,505,308 | B1 | * | 1/2003 | Schwarz | 714/30 |
| 6,662,136 | B2 | * | 12/2003 | Lamb et al. | 702/132 |
| 6,766,468 | B2 | * | 7/2004 | Barth et al. | 714/7 |
| 6,976,198 | B1 | * | 12/2005 | Vaida | 714/30 |
| 7,053,470 | B1 | * | 5/2006 | Sellers et al. | 714/30 |
| 7,085,971 | B2 | * | 8/2006 | Barth et al. | 714/30 |
| 2001/0054164 | A1 | * | 12/2001 | Tanizaki et al. | 714/718 |
| 2003/0070118 | A1 | * | 4/2003 | Nakao et al. | 714/30 |
| 2003/0107925 | A1 | * | 6/2003 | Koss et al. | 365/200 |
| 2003/0177415 | A1 | * | 9/2003 | Togashi et al. | 714/30 |
| 2004/0064767 | A1 | | 4/2004 | Huckaby et al. | |
| 2004/0230870 | A1 | * | 11/2004 | Wang et al. | 714/30 |
| 2004/0260975 | A1 | * | 12/2004 | Nagura | 714/30 |

* cited by examiner

*Primary Examiner*—Robert Beausoliel
*Assistant Examiner*—Joseph D. Manoskey
(74) *Attorney, Agent, or Firm*—Edell, Shapiro & Finnan, LLC

(57) ABSTRACT

An integrated circuit, in particular, an integrated memory, contains a control circuit for ascertaining an operating state of the circuit. A self-repair circuit, which is connected to the control circuit, is used to implement self-test and self-repair operation for checking the functioning of, and repairing, defective circuit sections of the integrated circuit. After a supply voltage has been applied to the integrated circuit, the control circuit ascertains an operating state of the integrated circuit and, in a manner dependent thereon, the self-repair circuit is activated by the control circuit in a self-controlling manner in order to put the integrated circuit into a self-repair mode for implementing self-test and self-repair operation. The integrated circuit can be tested for its functionality and repaired even after being soldered onto a module substrate.

15 Claims, 2 Drawing Sheets

INTEGRATED CIRCUIT, IN PARTICULAR INTEGRATED MEMORY, AND METHODS FOR OPERATING AN INTEGRATED CIRCUIT

CROSS REFERENCE TO RELATED APPLICATIONS

This application claims priority Under 35 USC §119(e) to German Application No. DE 10323865.4, filed on May 26, 2003, and titled "Integrated Circuit, In Particular Integrated Memory, and Methods for Operating an Integrated Circuit," the entire contents of which are hereby incorporated by reference.

FIELD OF THE INVENTION

The present invention relates to an integrated circuit, and more particularly, to an integrated memory, having a self-repair circuit for implementing self-test and self-repair operation for checking the functioning of, and repairing, defective circuit, and methods for operating an integrated circuit of this type.

BACKGROUND

Integrated circuits, in particular, integrated memories, for example, in the form of DRAMs (Dynamic Random Access Memory), are generally subject to extensive functional tests in the fabrication process. These functional tests are used, inter alia, to identify defective circuit sections, such as defective memory cells, defective bit lines, or defective word lines. As memory size increases, the costs of functional tests take up an ever larger proportion of the total production costs of a memory. In order to lower the test costs, there is increasing use of special techniques, for example, additional test logic implemented as a BIST (Built-In Self-Test) unit.

For repairing defective memory cells, integrated memories generally have redundant memory cells, which are usually combined to form redundant word lines or redundant bit lines, which can replace, in address terms, regular lines having defective memory cells. As a result, integrated memories, in particular, DRAMs, can still be fabricated economically in the context of the integration densities achieved nowadays. A memory is tested by an external test device, for example, and redundant elements are subsequently programmed based on a redundancy analysis. In this case, the addresses of those memory cells which have been tested and have been detected as being defective, are stored in a defect address memory in order, in a subsequent step, to replace these memory cells by defect-free redundant memory cells based on the stored addresses. Alternatively, a memory test of this type may be implemented in an analogous manner by a self-repair circuit (BIST unit) of the memory for implementing self-test and self-repair operation for checking the functioning of, and repairing, defective memory cells of the memory.

Even though intensive testing, repair and selection are usually effected at the wafer and component level, it is often the case that, after tested integrated memories have been applied to, in particular, soldered onto, a module substrate, memory cells fail, for example, on account of the thermal loading in the soldering step. This can give rise to costly subsequent repairs or may even mean the complete loss of the module.

SUMMARY

An integrated circuit, in particular, an integrated memory, can make it possible to cost-effectively implement reliable functional tests and repair of the integrated circuit at later points in time. In addition, methods for operating an integrated circuit of this type can open up effective test and repair possibilities.

The integrated circuit in accordance with the present invention, in particular, in the form of an integrated memory, can have, in addition to a self-repair circuit for implementing self-test and self-repair operation for checking the functioning of, and repairing, defective circuit sections of the integrated circuit, a control circuit for ascertaining an operating state of the integrated circuit. This control circuit can be designed such that, after a supply voltage has been applied to the integrated circuit, the control circuit can ascertain an operating state of the integrated circuit. In a manner dependent thereon, the self-repair circuit can be activated by the control circuit in a self-controlling manner in order to put the integrated circuit into a self-repair mode for implementing self-test and self-repair operation.

In this case, the integrated circuit can be tested for its functionality even after being soldered onto a module substrate and, under certain circumstances, can be repaired in order to replace those circuit sections which have failed on account of the thermal loading in the soldering step by defect-free circuit sections. A module arrangement can be tested under the same ambient conditions as in the application, even over a relatively long time. An integrated circuit, which has already been integrated in a relatively large circuit system, can be tested once again for functionality and, if appropriate, repaired without it being necessary to undertake further soldering steps. Since, in addition, further signals are not required to implement a functional test and the supply voltage can be applied to the integrated circuit, the integrated circuit according to the invention can be tested for functionality and repaired in a relatively cost-effective manner by virtue of the parallelism that can be achieved. Since it is necessary to apply the supply voltage, a comparatively simple temperature oven can be used to vary the ambient temperature.

In accordance with one embodiment of the present invention, the control circuit can ascertain if a command is not received by the integrated circuit within a predetermined period of time, for example, within the period of time of 500 µs or 1 s following application of the supply voltage. The self-repair circuit can be activated by the control circuit in this case, i.e., the integrated circuit can automatically change to the self-repair mode. If the integrated circuit is put into the self-repair mode, self-test and self-repair operation of the integrated circuit can be implemented. Test and repair methods, which are already available on present-day modules, for example, in the form of BIST units, can be used.

In order to ensure that this self-repair mode can be activated once in order, for example, to avoid inadvertent activation when used in the application, the integrated circuit can have a memory circuit, which can be set with a value by the control circuit in the case of a self-repair mode to be implemented. For example, the memory circuit can be an electrical fuse, which is programmed, for example, blown, in the case of a self-repair mode to be implemented. The memory circuit can be evaluated by the control circuit. The self-repair circuit may not be activated, if the memory circuit has been set.

In order to test the integrated circuit under the same conditions as in the application, in accordance with a method according to the invention for operating the integrated circuit, the integrated circuit can be applied to, in particular, for example, soldered onto, a module substrate as a module. This module arrangement formed thereby can be connected to a voltage supply for providing the supply voltage for the integrated circuit and can put the integrated circuit into the self-repair mode.

In a further method for operating an integrated circuit according to the invention, the integrated circuit can be placed, separately or as part of a module, within an environment having a defined ambient temperature. The integrated circuit can be connected to a voltage supply for providing the supply voltage and the ambient temperature can be set in this case to a defined value during the self-repair mode. In this case, to continuously vary, in particular, to increase or to decrease, the ambient temperature during the self-repair mode to values which are critical for the circuit (in this case, the term "critical values" means that the functionality of the circuit is increasingly jeopardized at these values), the self-repair mode can be ended when there are no longer any possibilities of repairing the integrated circuit. It can be possible to exhaust the repair capability of the integrated circuit assuming that the defect frequency increases with increasing temperature.

BRIEF DESCRIPTION OF THE DRAWINGS

The invention is explained in more detail below with reference to the figures which represent exemplary embodiments of the present invention and are illustrated in the drawing, in which.

DETAILED DESCRIPTION

Figure 1:
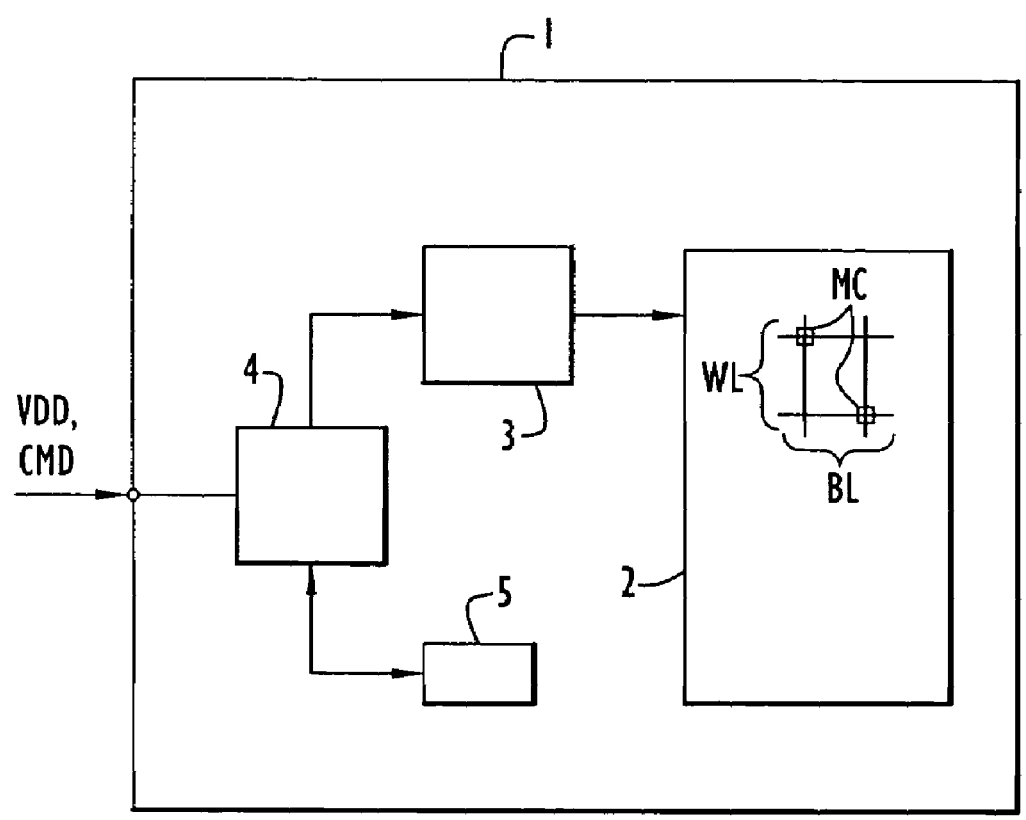
FIG. 1 shows an embodiment of an integrated memory according to the invention.

FIG. 1 shows an integrated memory 1 according to the invention having a memory cell array 2, in which memory cells MC are arranged at crossover points of word lines WL and bit lines BL. In this case, the memory cells MC have, in a known manner, a selection transistor and a storage capacitor which, in the present case, are not illustrated in FIG. 1 for reasons of clarity. In this case, a control terminal of the respective selection transistor can be connected to one of the word lines WL and the respective storage capacitor can be connected to one of the bit lines BL via the controlled path of the associated selection transistor. The memory 1 shown in FIG. 1 is a DRAM, for example, in which the contents of the memory cells MC can be refreshed in a refresh mode having a predetermined refresh frequency. In this case, for the functionality of the memory, the data retention time of the memory cells for storing respective data signals can correlate with the refresh frequency. That means that, for satisfactory functionality of the memory cells, the data retention time of the latter generally should not undershoot the duration of a refresh period.

In order to implement a self-test and self-repair operation with regard to the data retention time of the memory cells MC, the memory 1 can have a self-repair circuit 3, which is, for example, a BIST unit, in particular. According to the invention, a control circuit 4 can be provided in order to ascertain an operating state of the integrated memory 1. In particular, for example, the control circuit 4 can ascertain if a command CMD is not received by the memory 1 within a predetermined period of time, for example, within 500 µs or 1 s, following application of the supply voltage VDD to the memory 1. This operating state can be ascertained by the control circuit 4 following application of the supply voltage VDD to the memory 1 and, in a manner dependent thereon, the self-repair circuit 3 can be activated by the control circuit 4 in a self-controlling manner. This means that the memory can be put into a self-repair mode for implementing self-test and self-repair operation in order to check the functioning of, and repair, defective memory cells. In particular, the self-repair circuit 3 can be activated by the control circuit 4 in the above-described event that a command CMD is not received by the memory 1 within a predetermined period of time following application of the supply voltage VDD.

The memory 1 furthermore can have a memory circuit 5, which, for example, can have at least one electrically programmable fuse. The memory circuit 5 can be set with a value by the control circuit 4 in the case of a self-repair mode to be implemented and, in particular, the electrically programmable fuse can be blown. The self-repair mode can be activated once to prevent inadvertent activation of the self-repair mode in the application. To this end, the memory circuit 5 can first be evaluated by the control circuit 4 following application of the supply voltage VDD. The self-repair circuit 3 is not activated by the control circuit 4, if the memory circuit 5 has already previously been set.

Figure 2:
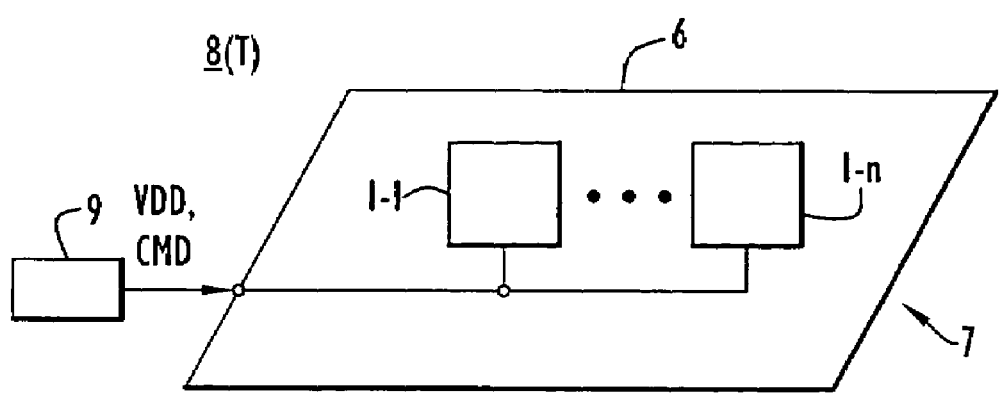
FIG. 2 shows an embodiment of a module arrangement having a plurality of integrated memories according to the invention as shown in FIG. 1.

FIG. 2 shows a diagrammatic illustration of an embodiment of a module arrangement having a plurality of integrated memories according to the invention as shown in FIG. 1. A plurality of memories 1-1 to 1-n, which can be constructed in accordance with the principle of the memory 1 shown in FIG. 1, can be applied to, in particular, soldered onto, for example, the module substrate 6 as a respective memory module. In order to operate the module arrangement 7 thus formed, a voltage supply 9 can provide a supply voltage VDD for the module arrangement 7 the memories 1-1 to 1-n can be put into the self-repair mode after a predetermined period of time following application of the supply voltage VDD has elapsed, if a command is not received by the respective memory within this predetermined period of time. This makes it possible to test and repair the module arrangement 7 under the same conditions as in the application, even over a relatively long time. It can be possible for the memories to be left on the module arrangement. It can also be possible, by virtue of the degree of parallelism when testing a plurality of memory module arrangements, to lower the test costs since the supply voltage VDD is applied for the test.

A test of this type may also take place in combination with a simple temperature oven, the memory module arrangement being placed within an environment 8 having a predefined ambient temperature T. In this case, the ambient temperature T can rise over a relatively long period of time during the self-repair mode. The self-repair mode can be ended when there are no longer any possibilities of repairing the integrated memories. As a result, the repair capability of an individual memory can be fully exhausted assuming that the data retention time of the individual memory cells decreases with increasing ambient temperature and the relatively weak memory cells (in terms of data retention time) can be detected and repaired over the temperature range.

Figure 3:
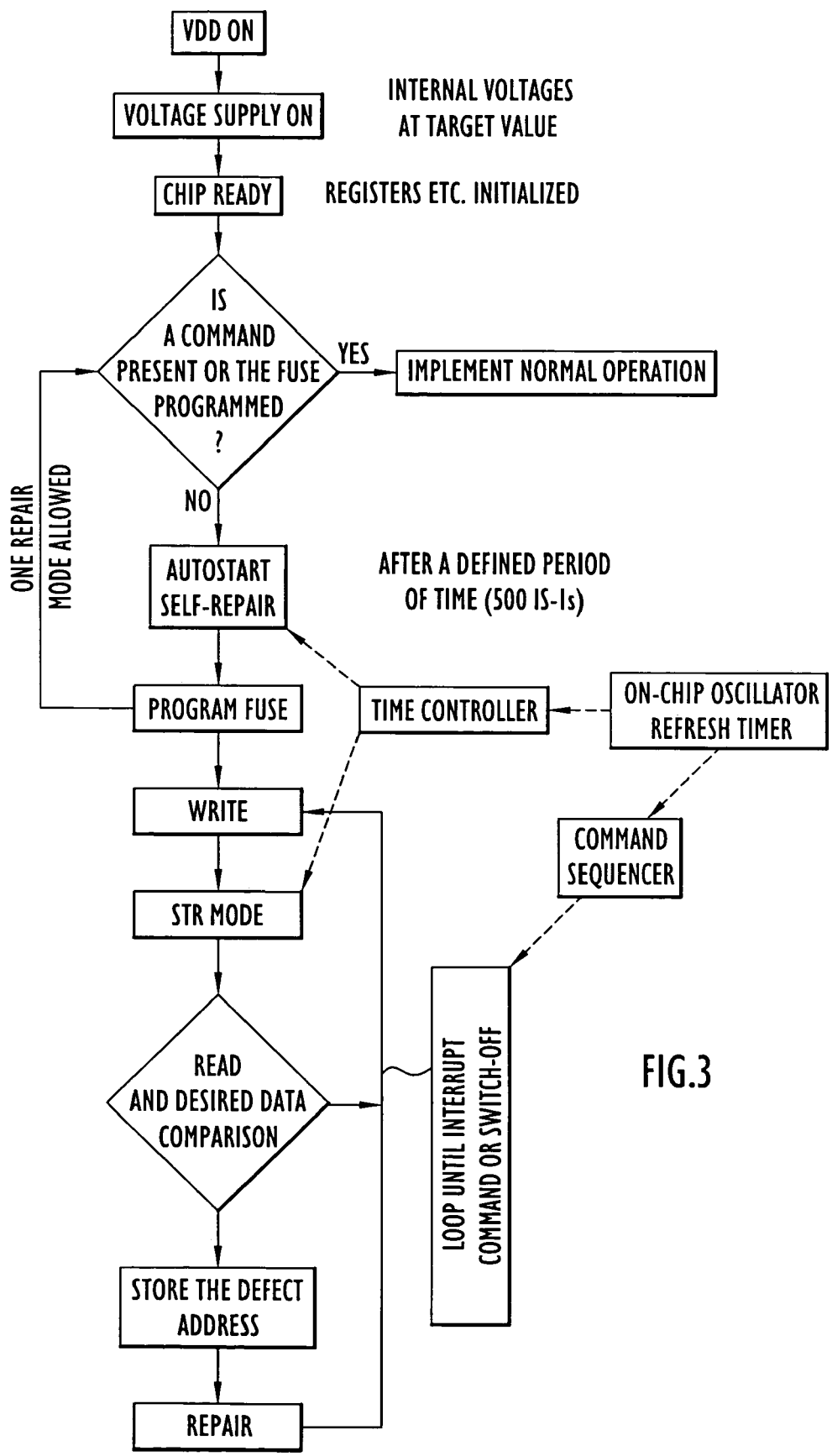
FIG. 3 shows a flow diagram for implementing a functional test and repair operation of an integrated memory according to the invention.

FIG. 3 illustrates a flow diagram for implementing an exemplary functional test and repair operation of a memory according to the invention. At the beginning, the memory can be connected to a voltage supply for providing the supply voltage VDD. As soon as the supply voltage VDD is applied, the internal voltages of the memory can be set to the target value and the chip can be put into the standby state, in particular, for example, if the data and command registers are initialized. The control circuit 4 can subsequently ascertain whether a command is received by the memory or whether the programmable fuse of the memory circuit 5 is in the set state. Normal operation can be implemented in the event that one of these operating states occurs.

In the event that, after a predetermined period of time, for example, after the period of time of 500 µs or up to 1 s following application of the supply voltage VDD, a command is not received by the memory, the self-repair circuit 3 can be activated by the control circuit 4 in a self-controlling manner. As a result, self-repair can automatically be started. In order to ensure that this mode is activated once, the electrically programmable fuse can then be programmed in the memory circuit 5. This establishes that a one-off repair mode is allowed.

An internal on-chip oscillator can be used to write defined data topologies to write data registers provided on the memory. The data topologies can be written to the memory cell array 2 after passing through a scrambler, for example. Physical 1s, which are critical to the data retention time are written, for example, to the memory cells. The memory is subsequently put, with the aid of an internal refresh timer, into the self-time refresh mode (STR mode) for one minute, for example, in which the data signals stored in the memory cells can be refreshed at a preset refresh frequency. The memory can then be evaluated. The data signals, which have been written, can be supplied via a descrambler to read data registers provided on the memory. An evaluation can then be performed to determine which of the memory cells have not fulfilled the provisions as regards the data retention time, to which end a desired data comparison can be implemented. The addresses of the defective memory cells (i.e., defect addresses) can be stored in a defect address memory, which can be used as the initial basis for implementing subsequent repair. In this case, defective memory cells can be replaced by defect-free redundant memory cells.

This test cycle, from writing data signals to the memory cell array to repairing defective memory cells, can be implemented in a loop until an interrupt command for interrupting this sequence is received or the memory is switched off. The individual steps, from writing test data to repairing the memory cells, can be implemented with the aid of a command sequencer provided on the memory. The temporal sequences as regards autostarting self-repair and the STR mode can be monitored and controlled by a time controller.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

List of Reference Symbols

1 Integrated memory
1-1 to 1-n integrated memories
2 Memory cell array
3 Self-repair circuit
4 Control circuit
5 Memory circuit
6 Module substrate
7 Module arrangement
8 Environment
9 Voltage supply
MC Memory cells
BL Bit lines
WL Word lines
VDD Supply voltage
CMD Command
T Temperature

We claim:

1. An integrated circuit, comprising:
a control circuit for ascertaining an operating state of the integrated circuit; and
a self-repair circuit for implementing self-test and self-repair operation for checking the functioning of, and repairing, defective circuit sections of the integrated circuit, the self-repair circuit being connected to the control circuit,
wherein the control circuit activates the self-repair circuit to place the integrated circuit into a self-repair mode for implementing self-test and self-repair operation in response to determining that a command is not received by the integrated circuit within a predetermined period of time following application of a supply voltage to the integrated circuit.

2. The integrated circuit as claimed in claim 1, further comprising a memory circuit configured to be set with a value that indicates the self-repair mode has been implemented, wherein once the memory circuit has been set with the value, the control circuit is prevented from activating the self-repair circuit.

3. The integrated circuit as claimed in claim 1, further comprising a memory cell array, in which data signals are stored, the self-repair circuit implementing self-test and self-repair operation for checking the functioning of, and repairing, defective memory cells.

4. The integrated circuit as claimed in claim 3, wherein the self-repair circuit implements a self-test and self-repair operation with regard to a data retention time of the memory cells.

5. The integrated circuit as claimed in claim 1, wherein the integrated circuit comprises an integrated memory, and the self-repair circuit tests and repairs the integrated memory.

6. The integrated circuit as claimed in claim 2, wherein the memory circuit comprises an electrically programmable fuse which is blown to set the value in the memory circuit.

7. The integrated circuit as claimed in claim 2, wherein setting the value in the memory circuit ensures that the self-repair mode is implemented only once in the integrated circuit.

8. A method for operating an integrated circuit comprising a self-repair circuit for implementing a self-repair operation for repairing defective circuit sections of the integrated circuit, the method comprising:
soldering the integrated circuit onto a module substrate to form a module arrangement;
connecting the module arrangement to a voltage supply to provide a supply voltage to the integrated circuit; and
performing the self-repair operation by the self-repair circuit in response to the integrated circuit not receiving a command within a predetermined period of time following application of the supply voltage to the integrated circuit.

9. The method for operating an integrated circuit as claimed in claim 8, further comprising:
    placing integrated circuit within an environment having a predetermined ambient temperature prior to connecting the voltage supply; and
    setting the ambient temperature to a predetermined value during the self-repair operation.

10. The method as claimed in claim 9, wherein the ambient temperature is varied during the self-repair operation to a plurality of values, and the self-repair mode is ended when no more repairs of the integrated circuit are possible.

11. The method as claimed in claim 8, wherein performing the self-repair operation includes repairing a memory array of the integrated circuit.

12. The method as claimed in claim 8, further comprising:
    setting a value in a memory circuit to indicate that the self-repair operation has been performed in integrated circuit; and
    preventing the self-repair operation from being performed in the integrated circuit once the value has been set in the memory circuit.

13. The method as claimed in claim 12, wherein setting the value in the memory circuit includes blowing an electrically programmable fuse.

14. The method as claimed in claim 12, wherein setting the value in the memory circuit ensures that the self-repair mode is implemented only once in the integrated circuit.

15. An integrated circuit, comprising:
    a self-repair circuit configured to perform a self-repair operation for repairing defective circuit sections of the integrated circuit; and
    a control circuit configured to automatically activate the self-repair circuit to perform the self-repair operation in response to applying a supply voltage to the integrated circuit without need of the integrated circuit receiving a command for initiating the self-repair operation.

* * * * *